United States Patent
Nishikawa et al.

(10) Patent No.: US 6,323,053 B1
(45) Date of Patent: Nov. 27, 2001

(54) GROWTH OF GAN ON SI SUBSTRATE USING GASE BUFFER LAYER

(75) Inventors: Takashi Nishikawa; Yoichi Sasai, both of Osaka; Makoto Kitabatake, Nara, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/395,175

(22) Filed: Sep. 14, 1999

Related U.S. Application Data

(62) Division of application No. 09/094,617, filed on Jun. 15, 1998, now abandoned.

(30) Foreign Application Priority Data

Jun. 16, 1997 (JP) .................................................. 9-158366

(51) Int. Cl.$^7$ .................................................. H01L 21/00
(52) U.S. Cl. .................................................. 438/46
(58) Field of Search .............................. 438/46, 478, 503, 438/973, 974; 117/952

(56) References Cited

U.S. PATENT DOCUMENTS

| | | | |
|---|---|---|---|
| 5,041,186 | 8/1991 | Nishio et al. | 156/620.2 |
| 5,380,396 | 1/1995 | Shikida et al. | 156/630 |
| 5,385,862 | * 1/1995 | Moustakas . | |
| 5,677,538 | 10/1997 | Moustakas et al. | 250/370.12 |
| 5,804,839 | 9/1998 | Hanaoka et al. | 257/123 |
| 5,880,485 | 3/1999 | Marx et al. | 257/94 |
| 5,902,393 | 5/1999 | Nido et al. | 117/2 |
| 5,940,684 | 8/1999 | Sahkuda et al. | 438/46 |

FOREIGN PATENT DOCUMENTS 08083928    3/1996   (JP) .

OTHER PUBLICATIONS

Zhang, X. et al., "Observation of inversion layers at AlN–Si interfaces fabricated by metal organic chemical vapor deposition", Electronics Letters, vol. 32, No. 17, pp. 1622–1623.*

S. Nakamura, "GaN Growth Using GaN Buffer Layer", Japanese Journal of Applied Physics, vol. 30, No. 10A, pp. L1705–1707, Oct. 1991.

M.E. Lin et al. "GaN Grown on Hydrogen Plasma Cleaned6H–SiC Substrates", Appl. Phys. Lett. 62(7), pp. 702–704, Feb. 15, 1993.

J.E. Palmer, et al. "GaAs on Si (111) with a Layered Structure GaSe Buffer Layer", Journal of Crystal Growth 150, pp. 685–690, 1995.

* cited by examiner

Primary Examiner—Charles Bowers
Assistant Examiner—K Christianson
(74) Attorney, Agent, or Firm—McDermott, Will & Emery

(57) ABSTRACT

As a pretreatment of a substrate, a substrate of Si having the (111) surface orientation as a main surface is soaked in hydrofluoric acid, so as to form a H atomic layer for terminating dangling bonds on the main surface of the substrate. Then, the substrate is placed in a highly evacuated growth chamber in an MBE system, and a Ga molecular beam and a Se molecular beam are supplied onto the H atomic layer on the substrate, so as to grow a buffer layer of GaSe, that is, a van der Waals crystal. Next, with the supply of the Se molecular beam stopped, a $N_2$ gas activated by using radio frequency or electron cyclotron resonance is supplied instead as a nitrogen source onto the buffer layer on the substrate, so as to form a semiconductor layer of GaN.

16 Claims, 12 Drawing Sheets

γ-GaSe R3m         β-GaSe P6₃/mmc      ε-GaSe P6̄m2 a=3.74Å c=23.86Å   a=3.75Å c=15.94Å    a=3.74Å c=15.89Å

- ● Ga
- ○ N
- ◍ Se
- ∘ H
- ⦸ Si

14(GaN)

13(GaSe)

12 : TERMINATING HYDROGEN

11(Si)

Si(111): a=3.84Å

GaSe: a=3.76Å

GaN: a=3.18Å

Si(111): a=3.84Å

GaSe: a=3.76Å

GaN: a=3.18Å

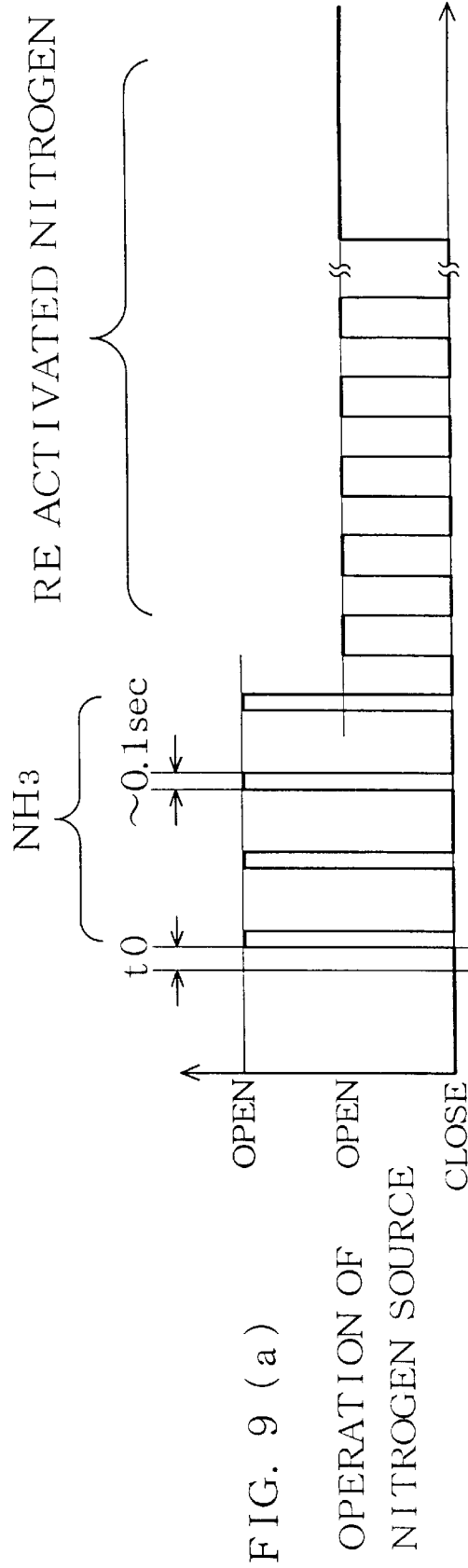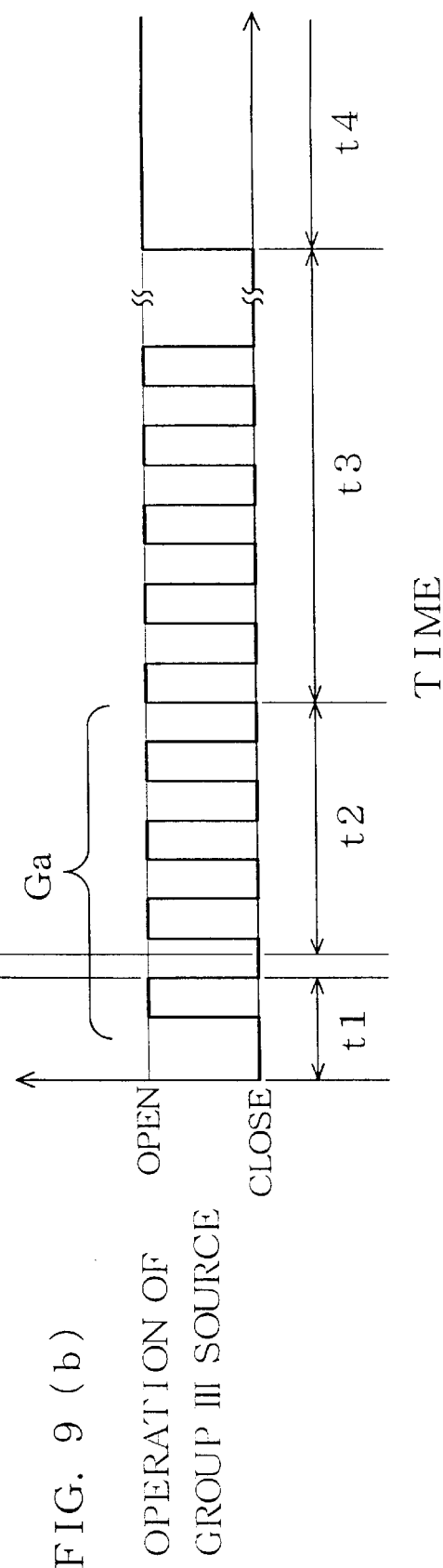
FIG. 9(a) OPERATION OF NITROGEN SOURCE
FIG. 9(b) OPERATION OF GROUP III SOURCE

GROWTH OF GAN ON SI SUBSTRATE USING GASE BUFFER LAYER

This is a divisional of application Ser. No. 09/094,617, filed Jun. 15, 1998, now abandoned.

BACKGROUND OF THE INVENTION

The present invention relates to a method and a device for manufacturing a GaN semiconductor crystal including gallium (Ga) and nitrogen (N).

Recently, a quality thin film of a GaN crystal can be obtained by using the metal organic vapor phase epitaxy (MOVPE) for growing a GaN semiconductor crystal on a substrate of sapphire ($Al_2O_3$). As a result, a light emitting device with a short wavelength has been realized. Under such circumstances, a blue light emitting diode (LED) has become capable of emitting light in a wavelength region ranging between blue and green, and has started to be practically used, together with a red LED, in a multicolored LED display device and a traffic signal. Furthermore, realization of a blue laser diode by using a GaN crystal has increased future possibility that quality image data can be recorded in a compact disk recording medium.

Also, in accordance with the development of the GaN crystal growth technique, a high frequency electronic device having both a high breakdown voltage and an environmental resistance has become realized. Specifically, in high frequency electronic devices using a GaAs or InP semiconductor, those used at large power where the breakdown voltage is insufficient or used in the case where an additional mechanism for heat radiation, cooling or the like is conventionally required have been regarded to become applicable to simplification and compactness of a device set by eliminating such an additional mechanism.

For example, first paper "Jpn. J. Appl. Phys. 30, L1705 (1991)" describes growth of a GaN semiconductor crystal on a substrate of sapphire for realizing a light emitting device with a short wavelength. Also, second paper "Appl. Phys. Lett. 62, 702 (1993)" describes growth of a GaN semiconductor crystal on a substrate of silicon carbide (SiC) for realizing an electronic device with a high breakdown voltage.

As is described in these papers, in the case where different materials are used in a substrate and a crystal layer grown on the substrate by the MOVPE or a molecular beam epitaxy (MBE), in general, a buffer layer is grown on the substrate first and the desired crystal layer is grown on this buffer layer in order to relax discontinuity in the interface between the substrate and the crystal layer.

The growth of a GaN crystal on the substrate of sapphire described in the first paper, however, has the following several problems:

Sapphire and GaN both have a crystal structure of the hexagonal system. Although a GaN crystal grown at a comparatively low temperature of approximately 500° C. is used as the buffer layer, the lattice constants of sapphire and GaN are largely different from each other, and specifically, sapphire has the lattice constant of 2.74 Å and GaN has the lattice constant of 3.189 Å. Therefore, there is lattice mismatch of approximately 14% between them. Such a large difference in the lattice constant causes not only large strain in the vicinity of the interface between the sapphire and the GaN crystal but also dangling bonds, resulting in causing a large number of dislocations in the GaN crystal. Accordingly, even an LED practically used at present has a defect density of $1 \times 10^{10}$ cm or more, and these defects lead to a large number of non-light emitting areas within the diode. Also, since light scattering and the like is caused by these defects, the luminous efficiency of the diode is largely degraded. Furthermore, the defects can be increased or expanded during the operation of the diode, so that the performance of the diode can be degraded and that the diode itself can be ultimately damaged. In this manner, such a defect is a factor in shortening the lifetime and degrading the reliability of the diode.

Moreover, although the substrate of sapphire has advantages of a low cost and stable quality, it is disadvantageous in the manufacture of devices because it cannot be cleaved and hence cannot be divided for isolation. In addition, the substrate of sapphire itself has an insulating property, and hence, it is impossible to adopt a device structure in which electrodes are respectively formed on a device forming surface and the other surface of the substrate. Accordingly, the manufacturing process can be disadvantageously complicated.

On the other hand, the growth of a GaN crystal on a substrate of SiC disclosed in the second paper has the following several problems:

Since a SiC crystal has the hexagonal system and a lattice mismatch ratio with GaN is as small as 3%, such a substrate is less affected to be degraded in the crystallinity by the lattice mismatch as compared with sapphire. Also, since SiC itself is conductive, electrodes can be formed on a device forming surface and the other surface of the substrate of SiC. Thus, the substrate of SiC can be regarded superior to the substrate of sapphire.

However, a generally available SiC substrate includes $1 \times 10^5$ cm$^{-2}$ or more etch pits, and these etch pits can disadvantageously cause a large number of defects in an epitaxial crystal layer grown on the substrate. Therefore, it is difficult to increase the yield of the epitaxial crystal layer, which makes efficient manufacture very difficult.

Moreover, SiC includes, in addition to the etch pits, a defect designated as a micropipe. The density of the micropipes is generally approximately $1 \times 10^2$ cm$^{-2}$, but each micropipe has a sectional area as large as 0.1 mm$^2$, which further degrades the yield of the epitaxial crystal layer. In addition, SiC is difficult to manufacture, and hence is very expensive. Therefore, it is difficult to decrease the manufacturing cost of a device using SiC as a substrate.

SUMMARY OF THE INVENTION

The object of the present invention is totally overcoming the aforementioned conventional problems, thereby definitely obtaining a GaN semiconductor crystal including less defects.

In order to achieve the object, in the present invention, a van der Waals crystal layer in which adjacent layers are bonded through a weak intermolecular force (namely, a van der Waals force) is grown on a substrate of a cubic system, and a GaN semiconductor layer is grown on the van der Waals crystal layer.

The first method of manufacturing a semiconductor of this invention comprises a buffer layer forming step of forming a buffer layer of a van der Waals crystal on a substrate having a crystal structure; and a semiconductor layer forming step of forming a semiconductor layer including gallium and nitride on the buffer layer.

In the first method of manufacturing a semiconductor, since the van der Waals crystal is used as the buffer layer, a difference in the lattice constant between the substrate and the GaN crystal can be relaxed by forming the GaN crystal layer on the buffer layer. Accordingly, defects derived from lattice strain and lattice mismatch can be prevented from being caused, resulting in improving the crystallinity of the semiconductor layer.

Since the van der Waals crystal can absorb or relax variation of the lattice constant caused by a temperature change, not only when GaN is grown but also when a multilayer structure including InGaN or AlGaN is grown or when the substrate temperature is changed during the manufacture, the strain derived from the change of the lattice constant can be suppressed.

In the first method, the crystal structure of the substrate is preferably a cubic system. In this manner, since widely used silicon (Si) and gallium arsenide (GaAs) are the cubic system and available Si or GaAs substrates have good quality, the crystallinity of the semiconductor layer can be definitely improved by using these substrates. Also, the Si and GaAs substrates are comparatively inexpensive, and hence, a cost of a device can be easily decreased. In addition, since Si and GaAs are conductive, electrodes can be formed on a device forming surface and the other surface. For example, in manufacturing a light emitting device, a p-type electrode can be formed on the device forming surface and an n-type electrode can be formed on the surface other than the device forming surface. Therefore, the manufacturing process can be simplified as compared with the case where an insulating substrate is used.

In the first method, the substrate preferably has a main surface having the (111) surface orientation. In this manner, the van der Waals crystal used as the buffer layer occasionally belongs to the hexagonal system, and the atomic arrangement can be more highly matched with the hexagonal system structure appearing on the (111) surface of the crystal of the cubic system such as GaAs and Si. Moreover, since the GaN crystal grown on the buffer layer is also the hexagonal system, the buffer layer can be highly matched in the atomic arrangement with both the substrate and the semiconductor layer (epitaxial layer). In addition, since both the van der Waals crystal and the GaN crystal belonging to the hexagonal system have merely one kind of crystal structure about the C axis, there is no possibility of occurrence of defects due to an anti phase boundary.

In the first method, the buffer layer is preferably formed out of gallium selenide, gallium sulfide, indium selenide, indium sulfide, molybdenum selenide or molybdenum sulfide. In this manner, the buffer layer can be definitely formed because these compounds can form the van der Waals crystal.

The first method preferably further comprises, between the buffer layer forming step and the semiconductor layer forming step, a step of substituting atoms exposed on a surface of the buffer layer with group V atoms. In this manner, the uppermost layer of the buffer layer and the semiconductor layer can be continuously grown through the covalent bond, and hence, it becomes further difficult to cause crystal defects such as a dislocation on the interface between the buffer layer and the semiconductor layer.

In the first method, the buffer layer forming step is preferably conducted by atomic layer epitaxy or migration enhanced epitaxy. In this manner, material atoms for each atomic layer can be separately supplied onto the substrate, and hence, the buffer layer of the van der Waals crystal and the GaN semiconductor layer can be definitely formed and the atoms exposed on the surface of the buffer layer can be definitely substituted with group V atoms.

In the first method, a buffer layer growth chamber used for forming the buffer layer in the buffer layer forming step is preferably different from a semiconductor layer growth chamber used for forming the semiconductor layer in the semiconductor layer forming step. In the case where the van der Waals crystal for forming the buffer layer includes a group VI element, the group VI element can be mixed as an n-type dopant into the semiconductor layer in the semiconductor layer forming step conducted after the buffer layer forming step, resulting in making it difficult to control a desired conductivity type. However, since the different growth chambers are used in the respective steps in the aforementioned manner, there is no possibility of the element included in the buffer layer mixing in the semiconductor layer.

In the first method, the semiconductor layer forming step preferably includes a step of supplying a gallium source to a growth chamber used for growing a crystal layer on the substrate and a step of supplying a nitrogen source to the growth chamber, and in the step of supplying the nitrogen source, an ammonia gas is preferably supplied to the growth chamber in an amount required for growth of the semiconductor layer without decreasing a degree of vacuum in the growth chamber. In this manner, since the ammonia gas is used as the nitrogen source, the quality of the GaN crystal can be improved as compared with the case where a general nitrogen gas is used. Also, since the ammonia gas as the nitrogen source is supplied to the growth chamber in the amount required for the growth of the semiconductor layer without decreasing the degree of vacuum in the growth chamber, the MBE which requires high vacuum in the growth chamber can be adopted, and the growth chamber can be prevented from being corroded by an excessive ammonia gas not contributing to the reaction but remaining in the growth chamber.

In the first method, the semiconductor layer forming step preferably includes a substrate placing step of placing, in a growth chamber, the substrate on which the buffer layer is formed; a gallium supplying step of supplying gallium in the form of a molecular beam onto the buffer layer; and an ammonia gas supplying step of supplying an ammonia gas onto the buffer layer through an electromagnetic valve provided to the growth chamber. In this manner, the electromagnetic valve for supplying the ammonia gas to the growth chamber can be opened and closed in a very short period of time differently from a hand valve. Therefore, the degree of vacuum in the growth chamber cannot be decreased during the operation of the valve. In addition, even when the valve is closed, the leakage rate can be suppressed to be sufficiently small differently from a general shutter used in a cell for supplying a molecular beam. As a result, the quality of the semiconductor layer including gallium and nitrogen can be definitely improved.

In the first method, a time interval is preferably provided between the gallium supplying step and the ammonia gas supplying step. Thus, each material can be provided with a time margin to be diffused onto the substrate, and the material can be uniformly diffused on the substrate. As a result, the crystallinity of the semiconductor layer to be grown can be further improved.

In the first method, the semiconductor layer forming step preferably includes a nitrogen gas supplying step of supplying a nitrogen gas in the form of plasma as a nitrogen source to the growth chamber. Thus, the crystal growth rate of the semiconductor layer can be further increased, and manufacture of so-called ternary or quaternary mixed crystals, in which aluminum (Al), indium (In) and boron (B) are simultaneously grown, can be eased. Therefore, the degree of freedom in the process can be increased. As a result, a semiconductor layer (epitaxial layer) for a desired short wavelength light emitting device or high breakdown voltage electronic device can be definitely formed.

The second method of manufacturing a semiconductor of this invention comprises a semiconductor layer forming step of forming a semiconductor layer including gallium and nitrogen on a substrate placed in a growth chamber, with at least a gallium source and a nitrogen source supplied and the supplied gallium source and nitrogen source reacted with each other on the substrate, and with an ammonia gas serving as the nitrogen source supplied to the growth chamber in an amount required for growth of the semiconductor layer without decreasing a degree of vacuum in the growth chamber.

In the second method of manufacturing a semiconductor, the ammonia gas is used as the nitrogen source. Therefore, the quality of the GaN crystal can be improved as compared with the case where a general nitrogen gas is used. Furthermore, since the ammonia gas as the nitrogen source is supplied to the growth chamber in the amount required for the growth of the semiconductor layer without decreasing the degree of vacuum in the growth chamber, the MBE requiring high vacuum in the growth chamber can be adopted. In addition, the growth chamber can be prevented from being corroded by an excessive ammonia gas.

Thus, a buffer layer is not defined in the second method of manufacturing a semiconductor differently from the first method.

In the second method, the semiconductor layer forming step preferably includes a substrate placing step of placing the substrate in the growth chamber; a gallium supplying step of supplying gallium in the form of a molecular beam as the gallium source onto a main surface of the substrate; and an ammonia gas supplying step of supplying the ammonia gas onto the main surface of the substrate through an electromagnetic valve provided to the growth chamber.

In the second method, a time interval is preferably provided between the gallium supplying step and the ammonia gas supplying step.

In the second method, the semiconductor layer forming step preferably includes a nitrogen gas supplying step of supplying a nitrogen gas in the form of plasma to the growth chamber as the nitrogen source.

The semiconductor manufacturing device of this invention is a device for forming a semiconductor layer including gallium and nitrogen on a substrate placed in a growth chamber, with at least a gallium source and a nitrogen source supplied and the supplied gallium source and nitrogen source reacted with each other on the substrate, and the growth chamber includes gallium source supplying means for supplying the gallium source and ammonia gas introducing means for introducing an ammonia gas, and the ammonia gas introducing means has an electromagnetic valve for intermittently controlling a flow of the introduced ammonia gas.

In the semiconductor manufacturing device of this invention, the ammonia gas serving as the nitrogen source is supplied through the electromagnetic valve included in the ammonia gas introducing means. Therefore, the electromagnetic valve can be operated in a time period shorter than 0.1 second, and hence, the degree of vacuum in the growth chamber cannot be deteriorated during the operation of the valve, and the leakage rate can be definitely suppressed to $1 \times 10^{-5}$ cc/sec. or less in the closed state. As a result, even when the ammonia gas, which can attain higher crystallinity than a nitrogen gas but is difficult to deal with, is used as the nitrogen source, the crystallinity of the semiconductor including gallium and nitrogen can be definitely improved.

In the semiconductor manufacturing device, the growth chamber preferably further includes nitrogen gas introducing means for introducing a nitrogen gas in the form of plasma. In this manner, the crystal growth rate of the semiconductor layer can be further increased, and the manufacture of so-called ternary or quaternary mixed crystal, in which Al, In and B are simultaneously grown, can be eased. Therefore, the degree of freedom of the process can be improved, and a semiconductor layer for a desired short wavelength light emitting device and high breakdown voltage electronic device can be definitely formed.

BRIEF DESCRIPTION OF THE DRAWINGS

FIGS. 9($a$) and 9($b$) show an operation sequence of respective Knudsen cells and valve in the device for manufacturing a semiconductor of the third embodiment, wherein FIG. 9($a$) shows an operation state of a cell or valve for a nitrogen source and FIG. 9($b$) shows an operation state of a cell for a group III element;

DETAILED DESCRIPTION OF THE INVENTION

Figures 1A, 1B:
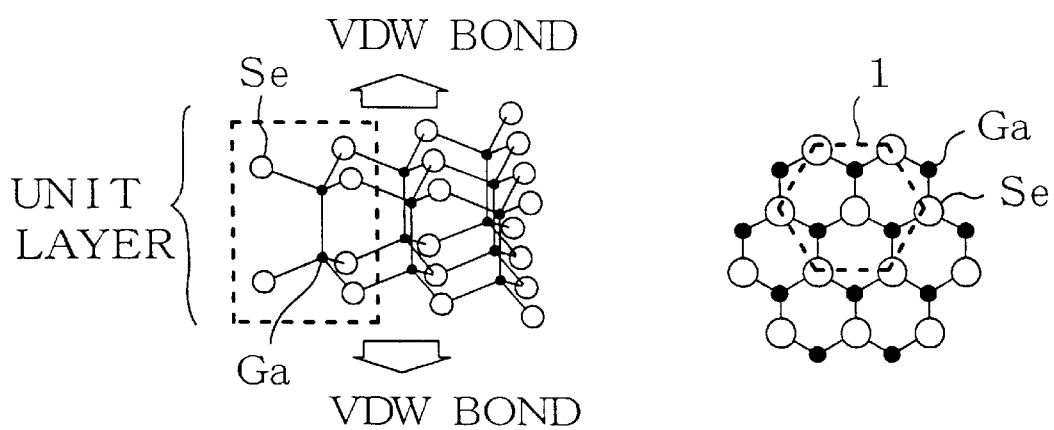
FIGS. 1($a$) through 1($e$) show the crystal structure of a GaSe crystal, which is a van der Waals crystal used as a buffer layer in a method of manufacturing a semiconductor according to a first embodiment of the invention, wherein FIG. 1($a$) is a schematic diagram of a unit layer, FIG. 1($b$) shows a C surface and FIGS. 1($c$) through 1($e$) are schematic diagrams for showing different crystal polytype.

First, the outline of a method of manufacturing a semiconductor according to the invention will be described.

In manufacturing a gallium nitride (GaN) semiconductor which is very difficult to obtain with good crystallinity, a van der Waals crystal is formed as a buffer layer between a substrate and a GaN crystal layer grown on the substrate in the present invention, so that a quality GaN crystal including less defects can be realized owing to the buffer layer.

A van der Waals crystal used as the buffer layer is a crystal having a multilayer structure like, for example, gallium sellenide (GaSe), and is a general term used for a crystal in which atoms in one layer are bonded through the covalent bond and one layer and another layer are bonded not through the covalent bond but through a van der Waals force, that is, a kind of weak intermolecular force.

A van der Waals crystal has a function to relax lattice mismatch between a substrate and a desired epitaxial layer grown on the substrate, so that less defects can be caused in the epitaxial layer.

As an example of crystal growth by using a van der Waals crystal layer, third paper "J. Crystal Growth, 150 (1995) 685" describes crystal growth by using a substrate of Si which is inexpensive and can be easily obtained as a quality crystal.

In the third paper, GaSe, that is, a van der Waals crystal, is used as a buffer layer for growing a GaAs crystal layer on a substrate of Si by the MBE.

Specifically, a substrate of Si having the (111) surface orientation as a main surface is soaked in an alcohol solution of ammonium persulfide ($(NH_4)_2S_x$), thereby terminating dangling bonds on the main surface of the substrate by sulfur (S). Subsequently, the substrate is placed in an MBE system, and a molecular beam of Se and a molecular beam of Ga are supplied onto the substrate, thereby forming a buffer layer of GaSe with a thickness of approximately 20 through 30 atomic layers. Then, with the supply of the Se molecular beam stopped and with As supplied instead, a semiconductor layer of GaAs is continuously formed.

However, a desired GaAs crystal layer cannot be grown by this method. The present inventors made examination on the cause in difficulty in obtaining a stable GaAs crystal layer, and found that it is because the GaAs crystal is grown on the buffer layer of the van der Waals crystal.

Although a GaAs crystal can be actually grown on a substrate of Si with a van der Waals crystal interposed by the method of growing a GaAs crystal disclosed in the third paper, it is impossible to avoid an anti phase boundary (APB) caused when GaAs with the (111) surface orientation is grown on Si with the (111) surface orientation. Due to the anti phase boundary, a large number of defects are caused in the GaAs crystal, so that the original effect of the buffer layer to improve the quality of the crystal cannot be achieved.

In growing GaAs including different atoms of Ga and As on the (111) surface of Si including a single type of atoms, since the uniformly continuous crystal structure has two types of surfaces, so-called A surface and B surface, an anti phase boundary is caused in random in growing these two types of crystal structure mixedly. Accordingly, this boundary is a discontinuous surface of the crystal and works as a defect.

On the other hand, the present inventors found the following: When a GaN crystal is grown on a van der Waals crystal, an anti phase boundary is not caused because the GaN crystal has the hexagonal system and the crystal structure of the semiconductor crystal grown on the van der Waals crystal does not include different structures. On the basis of this finding, in order to obtain a quality GaN crystal including less defects, a van der Waals crystal is used as a buffer layer on which a GaN crystal is grown in this invention.

Now, a method and a device for manufacturing a GaN semiconductor according to the present invention and a semiconductor laser diode obtained by the manufacturing method will be specifically described.

EMBODIMENT 1

A first embodiment of the invention will now be described with reference to the accompanying drawings.

Figures 1C, 1D, 1E:
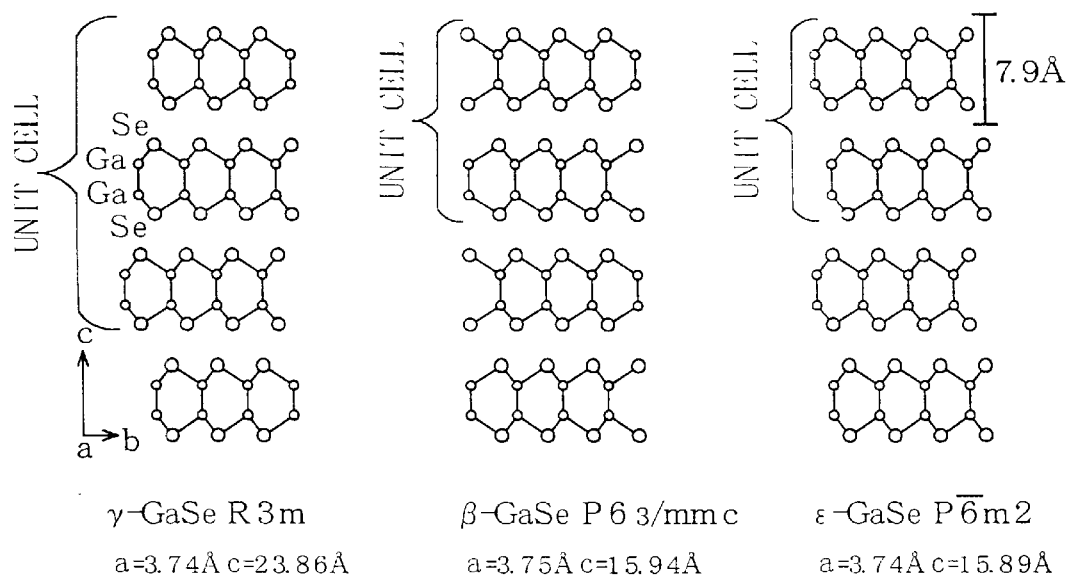

FIGS. 1(a) through 1(e) show the crystal structure of a GaSe crystal, that is, a van der Waals crystal, used as a buffer layer in a method of manufacturing a semiconductor of the first embodiment, wherein FIG. 1(a) is a schematic view of a unit layer, FIG. 1(b) is a diagram of a C surface and FIGS. 1(c) through 1(e) are diagrams of different crystal forms. In these drawings, a white circle corresponds to Se and a black circle corresponds to Ga.

As is shown in FIG. 1(a), GaSe has a layered structure, and a crystal lattice 1 shown with a broken line in FIG. 1(b) has a crystal structure belonging to a hexagonal system having symmetry of a point group symbol $D_3$ standing for three rotation axes in a direction of the normal line of the unit layer. As is shown in FIG. 1(a), Ga having a valency of 3 and Se having a valency of 6 are bonded to each other on a one-to-one basis in the order of Se—Ga—Ga—Se, thereby forming the unit layer. Se positioned on the interface with another unit layer does not have a dangling bond of the covalent bond. The original crystal includes plural unit layers, and these unit layers are not bonded through the covalent bond but weakly bonded through the intermolecular force called as the van der Waals (VDW) force. Accordingly, the overlap of the unit layers cannot be uniformly defined but has a given degree of freedom, and hence, the crystal includes plural different crystal forms (polytype or morphology) as is shown in FIGS. 1(c) through 1(e). Specifically, in the bond of unit layers of Se—Ga—Ga—Se, Se in the adjacent unit layers are not necessarily bonded to each other. In an actual crystal, three crystal forms, namely, one designated as γ-GaSe as is shown in FIG. 1(c), one designated as β-GaSe as is shown in FIG. 1(d) and one designated as ε-GaSe as is shown in FIG. 1(e), are comparatively occasionally observed, and these crystal forms are classified into space groups of R3m, P6$_3$/mmc and P¯6m2, respectively ("A. Koebel et al., J. Crystal Growth, 154 (1995) 269–274).

Accordingly, even when the respective unit layers have different lattice constants, these unit layers can remain with retaining their different lattice constants, and hence, a stress applied to the bond distance and the bond angle in a unit lattice can be small. Therefore, strain caused in the crystal can be small, and the crystal structure is not largely changed. As a result, when the van der Waals crystal is interposed as a buffer layer between different crystals, the change of the crystal structures caused by a difference in the lattice constant between the crystals sandwiching the buffer layer can be minimized. Thus, the factor in causing defects such as a dislocation can be remarkably reduced.

Figure 2:
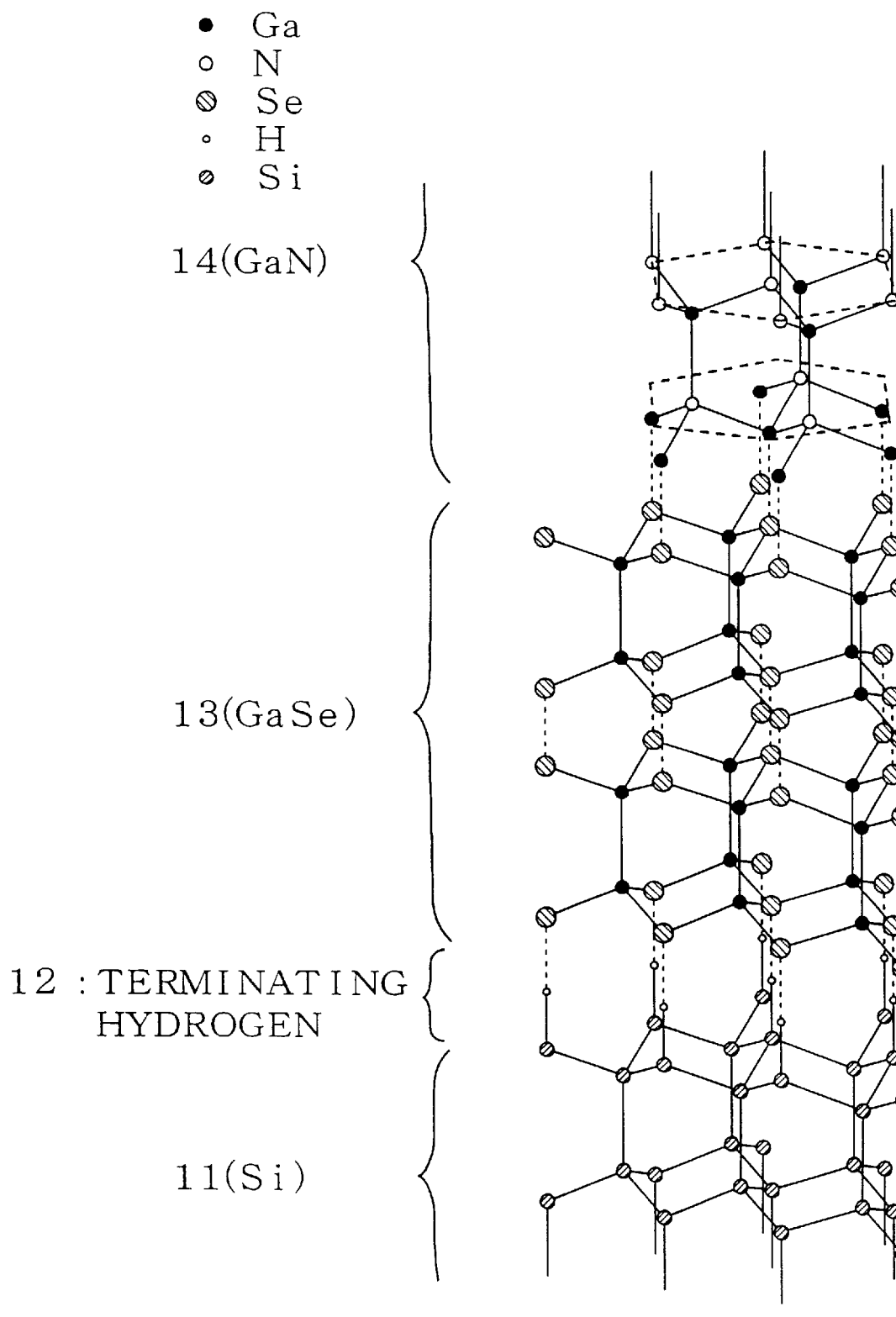
FIG. 2 is a schematic diagram for showing the crystal structure of a semiconductor obtained by the method of manufacturing a semiconductor of the first embodiment.

FIG. 2 is a schematic diagram of the crystal structure of the semiconductor obtained by the method of manufacturing a semiconductor of the first embodiment. In FIG. 2, a reference numeral 11 denotes a substrate of, for example, Si, having the (111) surface orientation, a reference numeral 12 denotes a hydrogen (H) atomic layer for terminating the (111) surface of the substrate 11, a reference numeral 13 denotes a buffer layer of a Van der Waals crystal of, for example, GaSe, and a reference numeral 14 denotes a semiconductor layer of GaN.

As is shown in FIG. 2, the crystal of the cubic system used as the substrate 11, such as Si with the diamond structure and GaAs having the zinc blande structure, has the symmetry of the point group symbol $D_3$ on the (111) surface as described above. Also, GaN of the semiconductor layer 14 originally has the hexagonal system of the wurtzite structure. Therefore, there is a large possibility of atoms belonging to the (111) surface of the substrate 11 respectively corresponding to atoms of the semiconductor layer 14, so that the crystal layer of the substrate 11 and the semiconductor layer 14 can be regularly bonded with each other at the atomic level.

When Si is used as the substrate 11, however, there is a difference of approximately 20% between the lattice constant of Si on the (111) surface (i.e., 3.84 Å) and the lattice constant of GaN of the semiconductor layer 14 (i.e., 3.189 Å). This large difference in the lattice constant can lead to a large number of defects caused in the semiconductor layer 14.

On the other hand, the buffer layer 13 of GaSe, the van der Waals crystal, has the hexagonal system, and hence, the atoms therein can well correspond to both the (111) surface of Si of the substrate 11 and the C surface of GaN of the semiconductor layer 14. Furthermore, as described above, the buffer layer 13 including plural unit layers can absorb the difference in the lattice constant between the substrate 11 and the semiconductor layer 14 grown in the direction of the normal line of the unit layer of the buffer layer 13.

When the buffer layer 14 of the van der Waals crystal is thus provided on the (111) surface of the substrate 11 of Si of the cubic system, the semiconductor layer 14 can be formed out of a GaN crystal including a minimized number of defects.

Now, the method of manufacturing a semiconductor of this embodiment will be specifically described with reference to the accompanying drawings.

Figure 3:
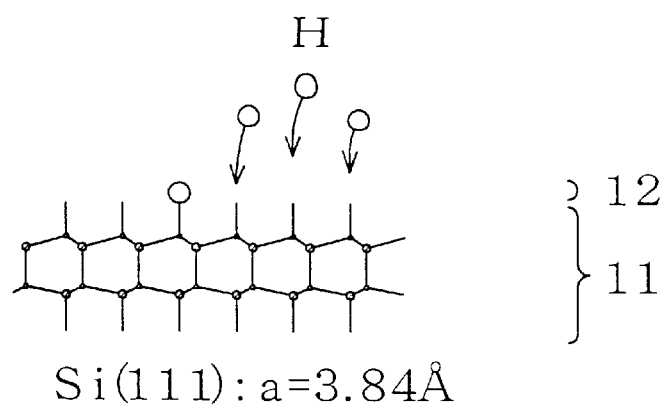
FIGS. 3($a$) through 3($c$) are schematic diagrams for showing respective crystal layers in procedures of the method of manufacturing a semiconductor of the first embodiment.
Figure 3:
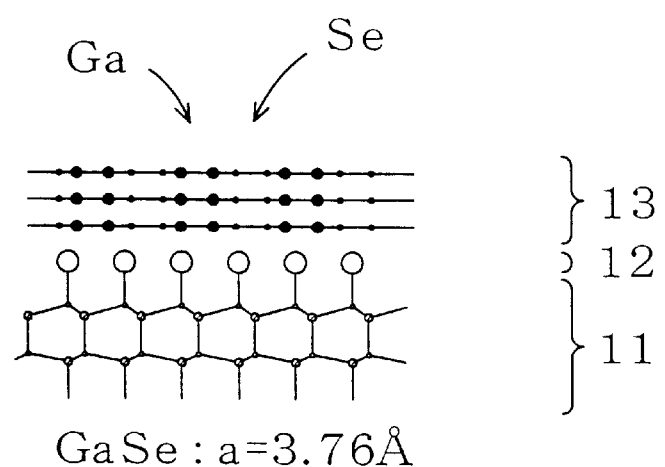
Figure 3:
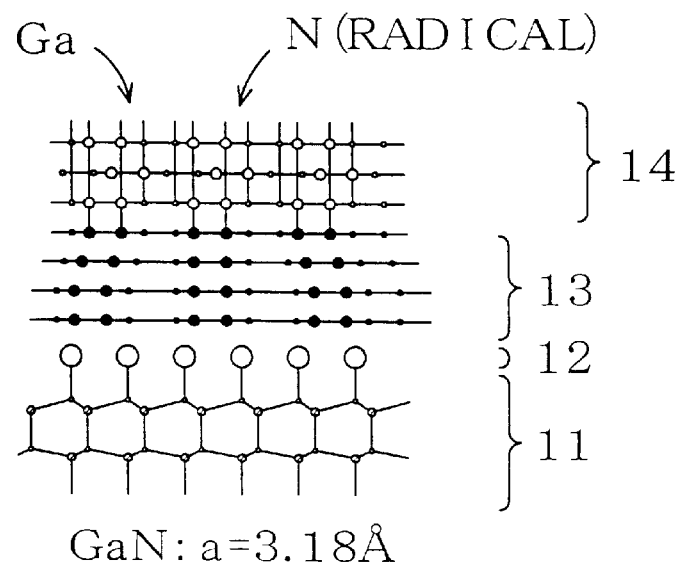

FIGS. 3(a) through 3(c) are schematic views of the respective crystal layers in procedures of the method of manufacturing a semiconductor of this embodiment. First, as is shown in FIG. 3(a), the substrate 11 of Si having the (111) surface orientation is soaked in hydrofluoric acid as a pretreatment of the substrate, thereby forming the hydrogen atomic layer 12 for terminating the dangling bonds on the main surface of the substrate 11.

Then, the pretreated substrate 11 is placed in, for example, a highly evacuated growth chamber in an MBE system, and a Ga molecular beam using a Ga metal as a gallium source and a Se molecular beam using a Se metal as a selenium source are supplied onto the hydrogen atomic layer 12 of the substrate 11 as is shown in FIG. 3(b), thereby growing the buffer layer 13 of GaSe.

Next, as is shown in FIG. 3(c), the supply of the Se molecular beam is stopped, and a $N_2$ gas as a nitrogen source activated by using a radio frequency (RF) or the electron cyclotron resonance (ECR) is supplied instead onto the buffer layer 13 of the substrate 11, thereby growing the semiconductor layer 14 of GaN.

As described so far, in this embodiment, the semiconductor layer 14 of GaN is grown on the buffer layer 13 of the van der Waals crystal. Accordingly, the van der Waals crystal can prevent the occurrence of defects derived from the difference in the lattice constant between the substrate 11 and the semiconductor layer 14, as well as prevent the occurrence of an anti phase boundary because the grown semiconductor layer 14 is GaN of the hexagonal system. As a result, the obtained GaN semiconductor crystal includes merely a very small number of defects.

In this embodiment, the MBE is adopted for growing the semiconductor layer 14, but the MOVPE or the metal organic CVD (MOCVD) can be adopted instead.

EMBODIMENT 2

A second embodiment of the invention will now be described with reference to the accompanying drawings.

Figure 4:
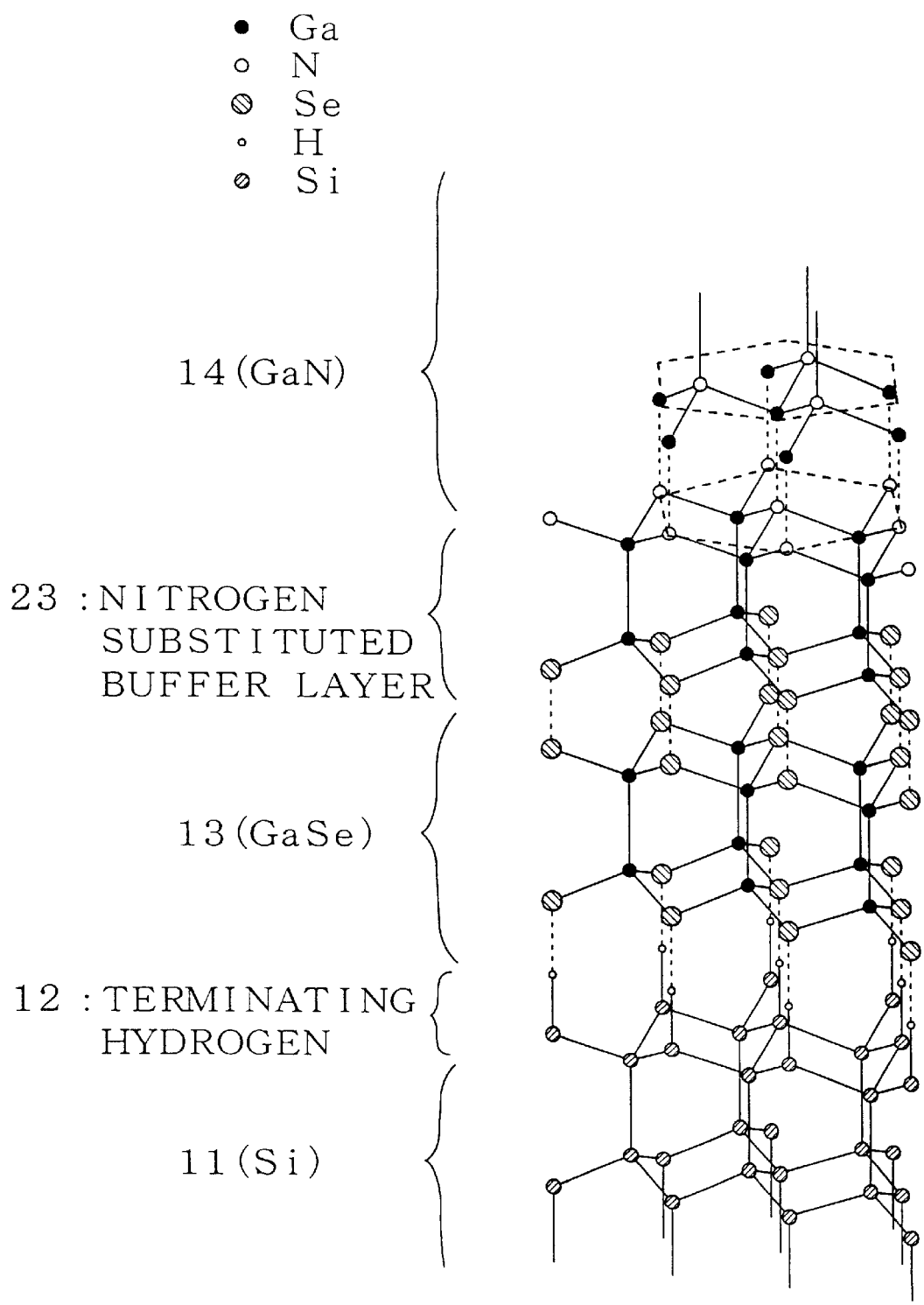
FIG. 4 is a schematic diagram for showing the crystal structure of a semiconductor obtained by a method of manufacturing a semiconductor according to a second embodiment of the invention.

FIG. 4 is a schematic diagram for showing the crystal structure of a semiconductor obtained by the method of manufacturing a semiconductor of the second embodiment. In FIG. 4, a reference numeral 11 denotes a substrate of Si having the (111) surface orientation, a reference numeral 12 denotes a hydrogen atomic layer for terminating the (111) surface of the substrate 11, a reference numeral 13 denotes a buffer layer of GaSe, that is, a van der Waals crystal, a reference numeral 23 denotes a nitrogen substituted buffer layer formed by substituting Se atoms on the surface (terminated layer) of the buffer layer 13 with N atoms, and a reference numeral 14 denotes a semiconductor layer of GaN.

In this manner, in the method of manufacturing a semiconductor of this embodiment, a group VI element (namely, Se) in the crystal unit layer of the buffer layer 13 of the van der Waals crystal closer to the semiconductor layer is substituted with a group V element (namely, N). Therefore, the crystal for forming the nitrogen substituted buffer layer 23 above the buffer layer 13 can be bonded with the crystal for forming the semiconductor layer 14 through the covalent bond. As a result, the buffer layer 13 can be continuous with the semiconductor layer 14 in the crystal structure.

Specifically, as described in the first embodiment, the buffer layer 13 including plural unit layers bonded through the van der Waals force and the nitrogen substituted buffer layer 23 can absorb and relax the difference in the lattice constant between the semiconductor layer 14 and the substrate 11. Accordingly, the crystal unit layer of the buffer layer 13 closer to the semiconductor layer 14 has a lattice constant substantially equal to that of the GaN crystal.

Moreover, since the nitrogen substituted buffer layer 23 formed by substituting the terminal atoms of the uppermost layer of the buffer layer 13 with N is thus provided, the atomic bond between the buffer layer 13 and the semiconductor layer 14 can be continuous. Accordingly, the Ga atoms of the semiconductor layer 14 closer to the buffer layer 13 shown in FIG. 2 are bonded with the Se atoms of the buffer layer 13 through the intermolecular force, but the Ga atoms of the semiconductor layer 14 closer to the buffer layer 13 shown in FIG. 4 are bonded with the substituted N atoms of the nitrogen substituted buffer layer 23 through the covalent bond. Therefore, the defects such as a dislocation can be further suppressed from being caused in the semiconductor layer 14 of this embodiment.

Now, the method of manufacturing a semiconductor of this embodiment will be specifically described with reference to the accompanying drawings.

Figure 5A:
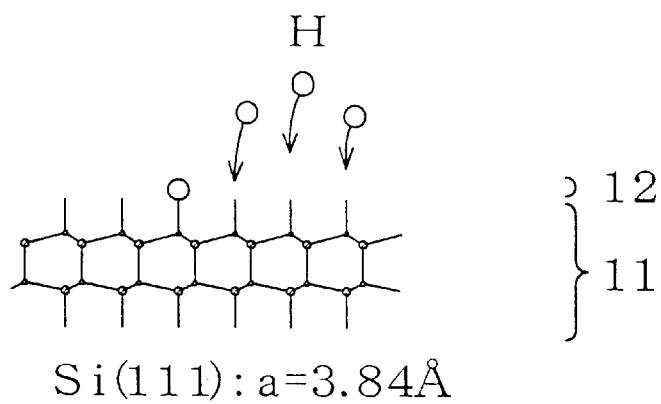
FIGS. 5($a$) through 5($c$) are schematic diagrams for showing respective crystal layers in procedures of the method of manufacturing a semiconductor of the second embodiment.
Figure 5B:
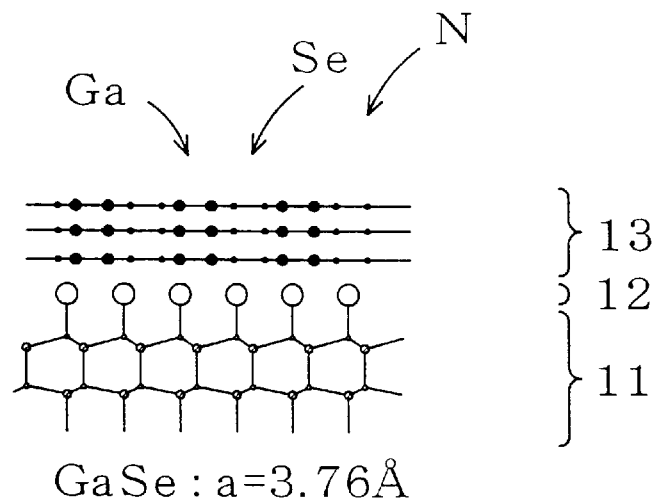
Figure 5C:
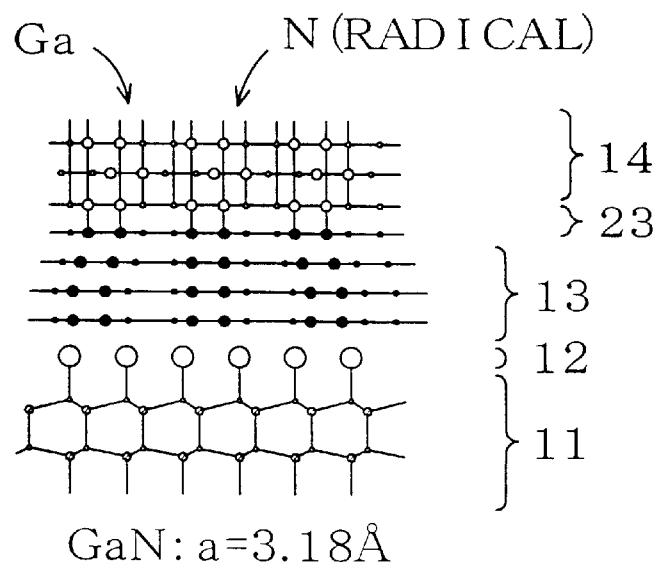

FIGS. 5(a) through 5(c) are schematic diagrams for showing the crystal structures in procedures of the method of manufacturing a semiconductor of this embodiment. First, as is shown in FIG. 5(a), the substrate 11 of Si having the (111) surface orientation is soaked in hydrofluoric acid as a pretreatment, thereby forming the hydrogen atomic layer 12 for terminating the dangling bonds on the main surface of the substrate 11.

Next, the pretreated substrate 11 is placed in, for example, a highly evacuated growth chamber of an MBE system, and a Ga molecular beam and a Se molecular beam are supplied onto the hydrogen atomic layer 12 of the substrate 11, thereby forming the buffer layer 13 of GaSe as is shown in FIG. 5(b). At this point, the Ga molecular beam and the Se molecular beam can be supplied at the same time, or can be alternately supplied so that one can be supplied while the other is being stopped to be supplied. As a method of supplying these materials so that an atomic layer of each material can be grown one by one, atomic layer epitaxy (ALE) or migration enhanced epitaxy (MEE) is adoptable. By using such a method, the atomic layers are supplied one by one in the order of Se—Ga—Ga—Se, so that each atomic layer can be formed as one unit layer of the buffer layer 13, and such a supply pattern is repeated plural times so that the buffer layer 13 can attain a multilayer structure. Thereafter, merely in the last supply pattern, the N atoms are supplied in stead of the ultimate Se atoms specifically in the order of Se—Ga—Ga—N—, thereby forming the nitrogen substituted buffer layer 23. Accordingly, the N atoms in the uppermost layer have the dangling bonds.

Then, as is shown in FIG. 5(c), on the nitrogen substituted buffer layer 23 on the substrate 11, the Ga molecular beam and an activated $N_2$ gas are supplied, thereby terminating the dangling bonds of the N atoms of the nitrogen substituted buffer layer 23 through the covalent bond with the Ga atoms of the semiconductor layer 14. Then, the semiconductor layer 14 of GaN is grown.

In each of the first and second embodiments, GaN is grown as the semiconductor layer 14, but GaN can be replaced with a ternary or quaternary mixed crystal with group III elements of In, Al and B added to the gallium source.

Also, GaSe is used as the van der Waals crystal, GaSe can be replaced with GaS, InSe, InS, $MoSe_2$ or $MoS_2$. However, since GaS has a smaller lattice mismatch ratio to GaN as compared with GaSe, S is more preferably used than Se in the van der Waals crystal. Also, when the semiconductor layer 14 of GaN is to be grown, a van der Waals crystal including Ga is preferably used. It is noted that even though GaS is materially superior, a S molecular beam cannot be easily generated as the Se molecular beam under the present conditions.

Furthermore, as the substrate 11, an inexpensive quality substrate which can be stably supplied or a conductive substrate is preferably used. For example, Si, GaAs, InP, GaP or ZnS, that is, a II-VI compound, can be used as the substrate 11.

Alternatively, the substrate 11 can be of ZnO or $Al_2O_3$ having no conductivity.

In the case where a material of the cubic system such as Si, GaAs, InP and GaP is used as the substrate 11, the (111) surface can be used as the main surface of the substrate as described above, and in the case where a material of the hexagonal system such as ZnO, ZnS and $Al_2O_3$ is used, the C surface can be used as the main surface.

Also, hydrogen is used for terminating the dangling bonds on the main surface of the substrate 11, but sulfur (S) can be used instead. In such a case, the substrate 11 is soaked in an alcohol solution of ammonium persulfide $((NH_4)_2S_x)$.

EMBODIMENT 3

A third embodiment of the invention will now be described.

The present inventors have found a first problem that, in growing a group III-V semiconductor layer on a buffer layer, desired conductivity control of the group III-V semiconductor layer is inhibited because a group VI element such as Se included in a van der Waals crystal used as the buffer layer works as an n-type dopant of the group III-V semiconductor.

Furthermore, they have found a second problem that a group III nitride (III-N) semiconductor obtained by the MBE using a $N_2$ gas in the form of RF plasma as the nitrogen source generally has a smaller electron mobility than a III-N semiconductor obtained by the MOVPE. The second problem is regarded to be caused because the semiconductor obtained by the MBE has poorer crystallinity.

As a result of various examinations on the cause of the poor crystallinity, the present inventors have found that the crystal growth of the III-N semiconductor is more three-dimensional in the MBE than in the MOVPE, and the found growth mechanism will now be described with reference to the accompanying drawing.

Figure 6:
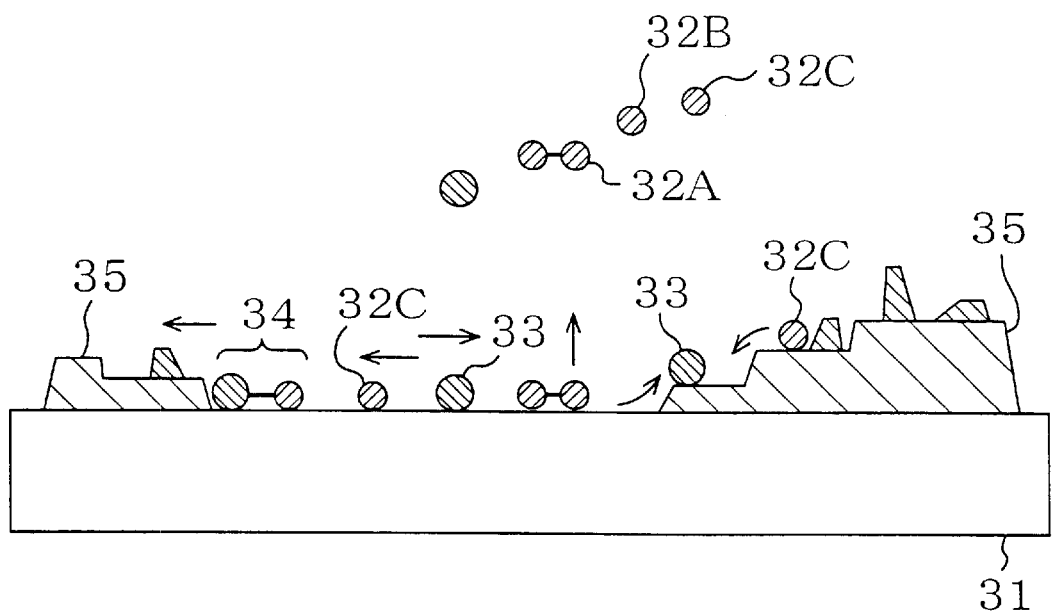
FIG. 6 is a schematic diagram for showing a crystal growth mechanism of GaN in the MBE using a nitrogen gas in the form of RF plasma as a nitrogen source.

FIG. 6 schematically shows a crystal growth mechanism of GaN by the MBE using a $N_2$ gas in the form of RF plasma as the nitrogen source. As is shown in FIG. 6, among Ga sources and nitrogen sources supplied onto a substrate 31, the $N_2$ gas in the form of RF plasma includes $N_2$ molecules 32A, N atoms 32B and N ions 32C. On the other hand, Ga atoms 33 having reached the main surface of the substrate 31 meet the radical N atoms 32B and N ions 32C, that is, reaction seeds, while being diffused onto the main surface, resulting in crystallizing as GaN 34. At this point, since the Ga atoms 33 have a large diffusion length and the N ions 32C have relatively small reactivity, a new crystal nucleus is difficult to generate. As a result, in stead of generating a new crystal nucleus, the generated GaN 34 dominantly grows with reaching and adhering to a previously generated crystal nucleus. Accordingly, the number of crystal nucleuses generated on the main surface of the substrate 31 is small, and the GaN grows three-dimensionally in a manner that an island 35 is formed. It seems that the crystallinity cannot be improved because a column-shaped domain is thus formed.

However, when the substrate 31 is formed out of GaN with high flatness, even though the growth of the generated GaN 34 is proceeded with adhering to the existing crystal nucleus, the three-dimensional growth accompanied with the formation of a new island is less easily caused because the substrate itself is of the same material as the crystal nucleus.

In the case where the substrate is formed out of a different material from a desired semiconductor as in the present invention, however, the three-dimensional growth caused on the main surface of the substrate affects subsequent crystal growth, which degrades the crystallinity. This applies to also the case where Si having the (111) surface orientation is used as the substrate or a van der Waals crystal is used.

On the other hand, a III-N semiconductor can be grown by the MBE using an ammonia ($NH_3$) gas as the nitrogen source. In this case, the crystallinity of the III-N semiconductor can be improved as compared with the case where the $N_2$ gas in the form of RF plasma is used. It seems that this is because two-dimensional crystal growth similar to the crystal growth obtained by the MOVPE can be proceeded by the MBE using the $NH_3$ gas as the nitrogen source. Specifically, the supplied $NH_3$ gas is decomposed by a catalytic function of Ga atoms, and decomposed N ions immediately react with the Ga atoms. Therefore, in stead of growing with adhering to a previously generated crystal nucleus, new crystal nucleuses are dominantly formed. Accordingly, the crystal is two-dimensionally grown uniformly on the entire main surface of the substrate, resulting in attaining high crystallinity.

However, when the $NH_3$ gas is used as the nitrogen source, the following various disadvantages are caused as a third problem: First, since the catalytic function of Ga is required for the decomposition of the $NH_3$ gas, it is difficult to form a ternary mixed crystal including AlN or InGaN or a quaternary mixed crystal including AlInGaN. Second, H ions generated through the decomposition of the $NH_3$ gas remain within the growth chamber, and the remaining H ions are incorporated into the crystal as an impurity. Thus, an activation ratio of a p-type carrier can be degraded. Thirdly, when a large amount of the $NH_3$ gas is used, the growth chamber can be corroded, resulting in shortening the lifetime of the growth chamber.

Now, a device for manufacturing a semiconductor according to a third embodiment, which is achieved in view of the aforementioned first through third problems, will be described with reference to the accompanying drawing.

Figure 7:
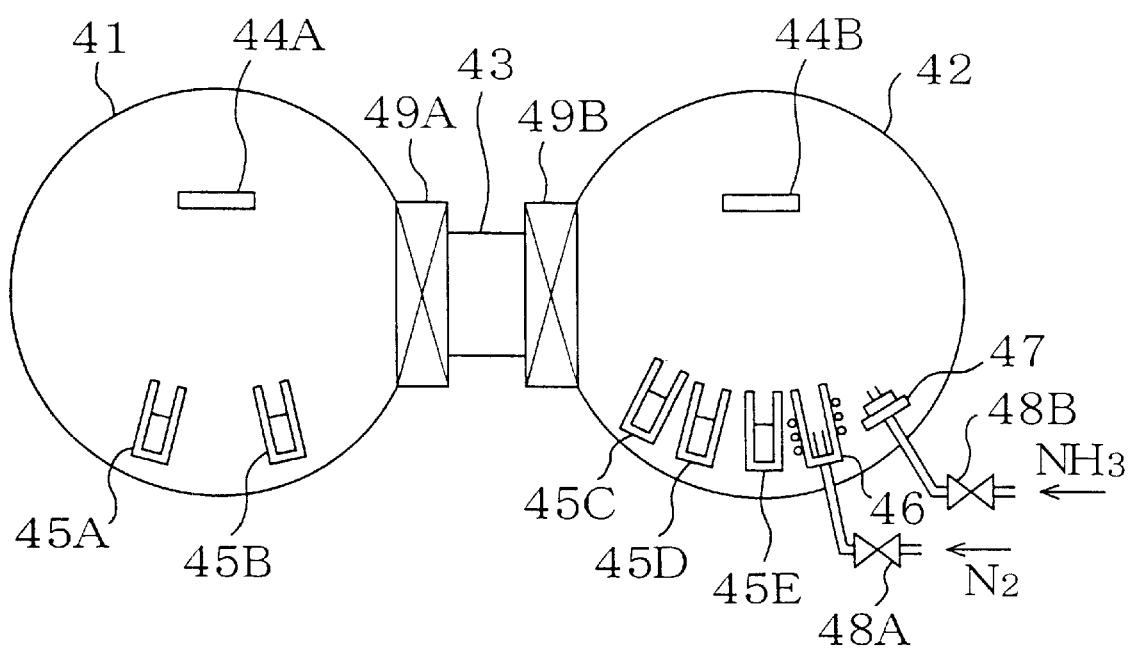
FIG. 7 is a front view for showing the sectional structure of a device for manufacturing a semiconductor according to a third embodiment of the invention.

FIG. 7 is a front view for showing the sectional structure of a device for manufacturing a semiconductor of the third embodiment. As is shown in FIG. 7, the device includes a first growth chamber 41 and a second growth chamber 42 communicated with each other through an airtight connection tube 43.

The first growth chamber 41 includes a first substrate holder 44A disposed with its holding surface facing the center of the vessel, and for example, a first Knudsen cell 45A and a second Knudsen cell 45B disposed with their effusion ports opposing the holding surface of the first substrate holder 44A.

The second growth chamber 42 includes a second substrate holder 44B disposed with its holding surface facing the center of the vessel, and for example, a third Knudsen cell 45C, a fourth Knudsen cell 45D and a fifth Knudsen cell 45E, serving as group III element source supplying means or dopant source supplying means, disposed with their emission ports opposing the holding surface of the second substrate holder 44B, an RF plasma cell 46 serving as nitrogen gas introducing means provided with an RF coil on the outer peripheral surface thereof, and an electromagnetic valve 47 serving as ammonia gas introducing means. The RF plasma cell 46 is supplied with a $N_2$ gas, that is, one nitrogen source, through a first hand valve 48A, and the first hand valve 48A is connected with an external nitrogen cylinder or nitrogen gas supply line through a highly airtight supply pipe. Also, the electromagnetic valve 47 for supplying a $NH_3$ gas, that is, another nitrogen source, to the second growth chamber 42 is connected with a second hand valve 48B through a supply pipe, and the second hand valve 48B is connected with an external ammonia gas cylinder or ammonia gas supply line through a highly airtight supply pipe.

The electromagnetic valve 47 includes a very precise valve, and the valve can be opened for a time period of less than 0.1 second. Also, a leakage rate of the valve in the closed state is less than $1 \times 10^{-5}$ cc/sec. Moreover, the valve has a pressure resistance of more than 85 atmospheres. Therefore, the valve can attain a very low back pressure and can supply a highly dense gas in the form of a pulse to a space in the second growth chamber 42 in a very short period of time.

A connecting portion between the first growth chamber 41 and the connection pipe 43 is provided with a first gate 49A for separating the first growth chamber 41 from the connection pipe 43. Similarly, a connecting portion between the second growth chamber 42 and the connection pipe 43 is provided with a second gate 49B for separating the second growth chamber 42 from the connection pipe 43.

A van der Waals crystal generally has a growth temperature of approximately 500° C. Therefore, in the case where the surface of a buffer layer is once exposed to the air and contaminants such as oxygen and carbon are adsorbed onto the surface, it is impossible to conduct a heat treatment in which the substrate bearing the buffer layer is heated to a high temperature for cleaning the surface of the buffer layer.

However, when the buffer layer of a van der Waals crystal is formed in the first growth chamber 41 and a desired III-N semiconductor crystal is subsequently formed on the substrate bearing the buffer layer in the second growth chamber 42, the III-N semiconductor crystal can be prevented from being contaminated with the group VI element included in the buffer layer. In addition, in transferring the substrate from the first growth chamber to the second growth chamber, the substrate is not exposed to the air, and hence, the III-N semiconductor crystal, which is difficult to be obtained with high quality, can definitely attain high quality.

Now, the method of forming the III-N semiconductor crystal by using the semiconductor manufacturing device having the aforementioned structure will be described with reference to the accompanying drawing.

The method of this embodiment includes a buffer layer growing step of growing a buffer layer of a van der Waals crystal in the first growth chamber 41 of FIG. 7 and a semiconductor layer growing step of growing a desired semiconductor layer on the buffer layer in the second growth chamber 42.

First, the first Knudsen cell 45A is previously charged with a group III element source of, for example, Ga or In. Alternatively, a metal having a high melting point such as Mo can be heated and evaporated with an electron beam annealer. The second Knudsen cell 45B is previously charged with a group VI element source such as Se, S, GaS, GaSe and $MoS_2$. At this point, when Se or S is used, a cell having a cracking mechanism can be used in addition to the Knudsen cell. Alternatively, another Knudsen cell can be additionally provided for using a combination of plural group III or group VI element sources. In this embodiment, the first Knudsen cell 45A is charged with a Ga source, and the second Knudsen cell 45B is charged with Se.

On the other hand, the third through fifth Knudsen cells 45C through 45E of the second growth chamber 42 are charged with desired group III element sources or dopant sources. As the group III element source, for example, Ga, Al or In is used, and when a metal having a high melting point such as B is used, it is heated and evaporated with an electron beam annealer. As the dopant source, Si serving as an n-type dopant or Mg serving as a p-type dopant is used. Moreover, such group III elements and dopants can be appropriately combined.

Next, a substrate for growing a semiconductor, which has been subjected to a predetermined pretreatment, is placed in the first growth chamber 41 to be held on the first substrate holder 44A. As described above, when a crystal of the cubic system such as Si and GaAs is used as the substrate, the (111) surface is used as the main surface, and when crystal of the hexagonal system such as ZnO and $Al_2O_3$ is used, the C surface is used as the main surface. In this embodiment, a Si substrate is used.

Next, the inside of the first growth chamber 41 is set in ultra-high vacuum at a pressure less than $10^{-8}$ Torr, where a buffer layer is grown as is shown in FIG. 3(b).

Then, the substrate bearing the buffer layer is transferred from the first growth chamber 41 to the second growth chamber 42. Merely at this point during the manufacture, the first gate 49A and the second gate 49B are opened. Thus, the contamination of the second growth chamber 42 with the group VI element existing in the first growth chamber 41 can be definitely avoided.

Figure 8:
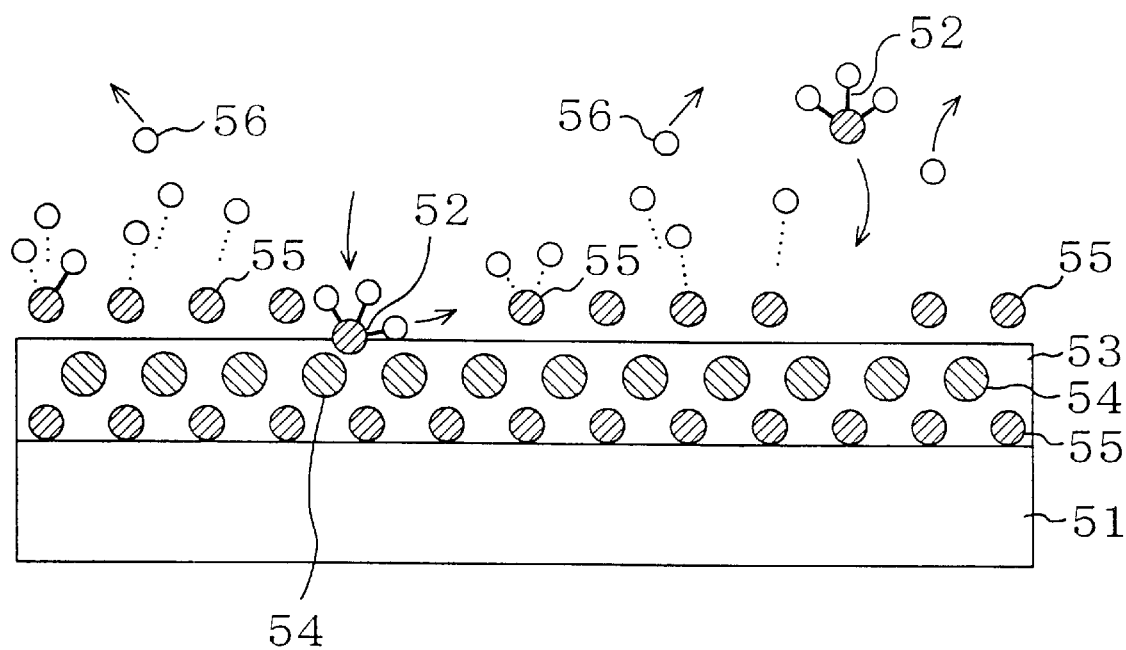
FIG. 8 is a schematic diagram for showing a crystal growth mechanism of GaN in a method of manufacturing a semiconductor of the third embodiment.

FIG. 8 schematically illustrates a crystal growth mechanism of a GaN crystal layer by using $NH_3$ as a nitrogen source in the semiconductor manufacturing device of this embodiment. As is shown in FIG. 8, $NH_3$ molecules 52 supplied in the form of a pulse from the tip of the electromagnetic valve 47 of the second growth chamber 42 onto a substrate 51 reach the main surface of the substrate, and are decomposed into radical N atoms 55 and H atoms 56 due to the interaction with Ga atoms 54 already diffused to form a crystal layer 53. The H atoms 56 are diffused in the growth chamber 42 and the N atoms are bonded with the Ga atoms 54 and crystallized in positions where they are decomposed.

In this manner, the decomposition of the $NH_3$ molecules 52 and the crystallization of GaN are proceeded through a catalytic reaction of Ga and subsequent series of reactions. Therefore, even when different materials are used in the substrate 51 and the desired crystal layer 53, the resultant crystal layer 53 can be formed in a flat shape without forming the island 35 as is shown in FIG. 6.

FIG. 9 shows the operation sequence of the respective Knudsen cells and valve in the device for manufacturing a semiconductor of this embodiment, wherein FIG. 9(a) shows the operation of the cell or valve used for the nitrogen source and FIG. 9(b) shows the operation of the cell used for the group III element. In this case, it is premised that the III-N semiconductor crystal is grown on the buffer layer of the van der Waals crystal. However, since $NH_3$ is used as the nitrogen source as described above, the grown crystal layer can be good at its flatness. Therefore, the crystal layer can be directly grown on the substrate 51 as is shown in FIG. 8.

First, as is shown in FIG. 9(b), in a first step t1, Ga is supplied from the third Knudsen cell 45C onto the substrate. Next, as is shown in FIG. 9(a), in a second step t2 after a predetermined time period t0 has elapsed, the electromagnetic valve 47 for supplying the $NH_3$ gas is opened for approximately 0.1 second, thereby supplying the $NH_3$ gas at a high density onto the substrate. At this point, the time for opening the electromagnetic valve 47 can be adjusted in accordance with the temperature of the substrate or the effusion rate of a pump, and specifically can be 0.5 second or less than 0.01 second reversely. Also, the number of times of supplying Ga and the $NH_3$ gas in the second step t2 can be appropriately determined in accordance with the flatness and the growth rate of the crystal. For example, in the case where the crystallinity is not very significant, the supply of Ga and the $NH_3$ gas can be repeated several times, and in the case where high crystallinity is required, the supply can be repeated several thousands times or more. Also, the predetermined time period t0 is preferably approximately $10^{-1}$ second through 10 seconds, and in this embodiment, the time period t0 is approximately 1 second.

Next, in a third step t3, the nitrogen source is switched from the RF plasma cell 46 of the second growth chamber 42 to the $N_2$ gas. Thus, the growth rate can be increased and the growth of a ternary mixed crystal or quaternary mixed crystal including Al, In or B can be eased. Specifically, as the group III element, not only Ga but also, for example, Al from the fourth Knudsen cell 45D, In from the fifth Knudsen cell 45E and the like are singly or plurally simultaneously supplied onto the substrate. At this point, when the $NH_3$ gas in the form of a pulse can be supplied at an appropriate interval between the supply of the nitrogen in the form of RF plasma, the improvement of the crystallinity and the growth of a mixed crystal can be both eased. Furthermore, the nitrogen in the form of RF plasma and the $NH_3$ gas can be simultaneously supplied.

Moreover, in the case where the growth rate and a composition ratio in a mixed crystal are desired to be increased after retaining the crystallinity of the semiconductor layer to be grown, a shutter of a cell necessary for supplying the nitrogen source and the group III element source can be continuously opened as is shown in a fourth step t4.

In the method of manufacturing a semiconductor of this embodiment, since the $NH_3$ gas in the form a pulse is supplied onto the substrate in a very short period of time as is shown in the second step t2, $NH_3$ in the amount required for the reaction can be definitely supplied onto the substrate without decreasing the degree of vacuum in the second growth chamber 42. Moreover, since the predetermined time period t0 is provided after the supply of Ga, the Ga atoms can be sufficiently diffused and uniformly distributed on the main surface of the substrate. As a result, the uniformly distributed Ga atoms can be reacted at a time with the $NH_3$ molecules for crystallization, and hence, the flatness of the GaN crystal and the uniformity in the surface can be remarkably improved.

Furthermore, since a proportion of $NH_3$ concerned with the reaction to $NH_3$ not concerned with the reaction is increased, there is no need to excessively supply the $NH_3$ gas. Therefore, a so-called memory effect, which is caused by excessive ammonia and hydrogen, that is, a decomposition product, remaining in the second growth chamber 42, can be scarcely caused. Accordingly, the excessive ammonia or hydrogen can be avoided from inhibiting doping, or can be prevented from harmfully affecting the crystal growth when a nitrogen gas in the form of RF plasma is subsequently supplied as the nitrogen source after the supply of the $NH_3$ gas.

EMBODIMENT 4

A fourth embodiment of the invention will now be described with reference to the accompanying drawing.

Figure 10:
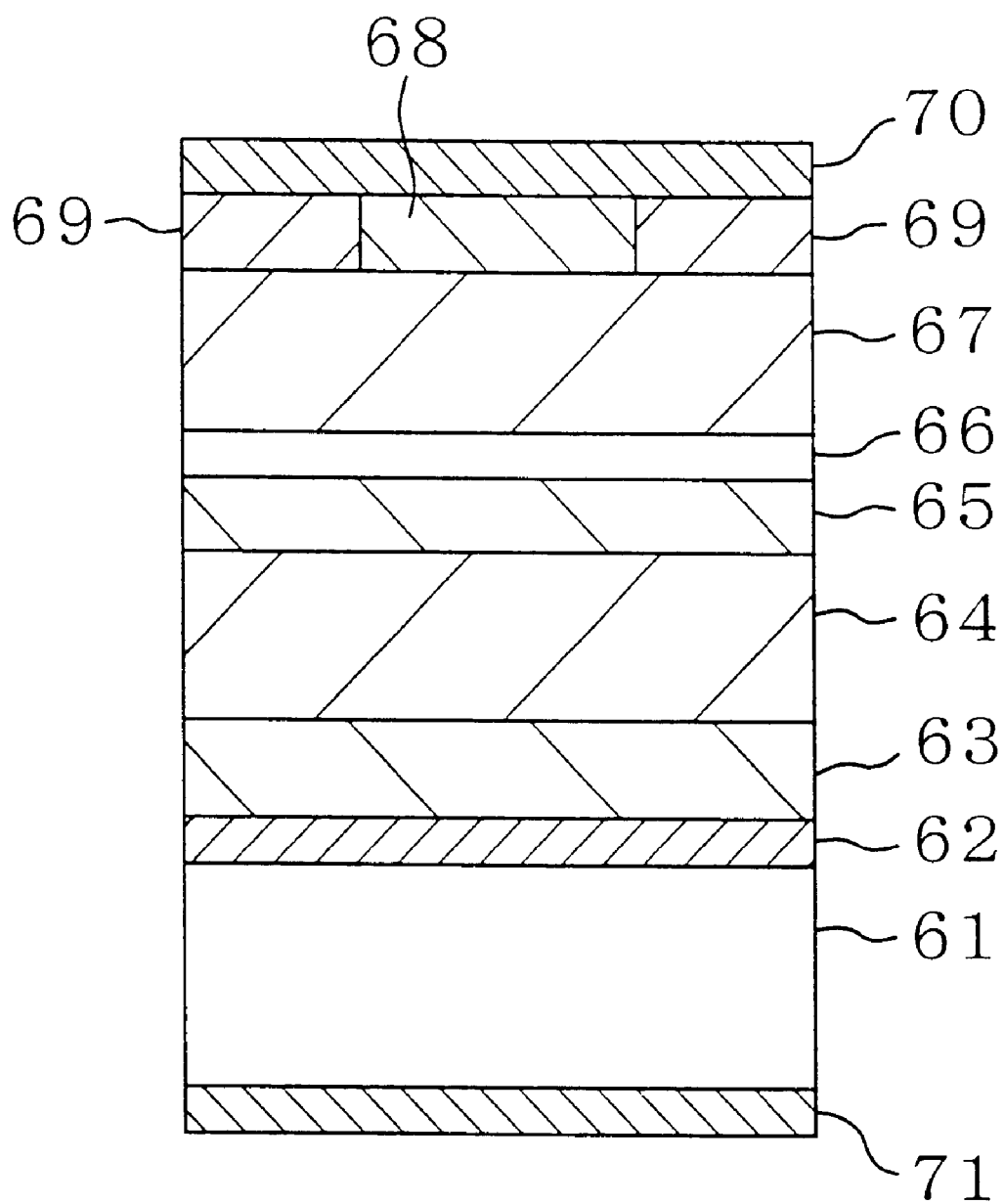
FIG. 10 is a sectional view for showing the structure of a short wavelength semiconductor laser diode according to a fourth embodiment of the invention.

FIG. 10 shows the sectional structure of a short wavelength semiconductor laser diode according to the fourth embodiment of the invention. As is shown in FIG. 10, on a substrate 61 of n-type Si having the (111) surface orientation as the main surface, an epitaxial layer including the following layers in this order is formed: A buffer layer 62 of GaSe, that is, a van der Waals crystal, including approximately several tens unit layers, a first n-type cladding layer 63 of n-type GaN, a second n-type cladding layer 64 of n-type AlGaN, an optical confinement layer 65 of n-type GaN, a multiple quantum well active layer 66 of InGaN, a p-type cladding layer 67 of p-type AlGaN, and a contact layer 68 of p-type GaN.

At the both ends of the contact layer 68, a buried current blocking layer 69 with a high resistance is formed by, for example, oxidation or introducing proton. On the contact layer 68, a p-type electrode 70 is formed, and on the surface of the substrate 61 other than the main surface, an n-type electrode 71 is formed.

The epitaxial layer of this embodiment is realized by the method and the device for manufacturing a GaN semiconductor of this invention. Accordingly, as described above, on the substrate 61 of Si, which is inexpensive and has a high quality, the buffer layer 62 of a van der Waals crystal having a large degree of freedom in the bond is provided. Therefore, the crystals in the respective layers included in the GaN epitaxial layer attain good quality, and a short wavelength (blue) semiconductor laser diode having a desired operation characteristic can be definitely realized at a low cost. Also, the diode can be suppressed from being degraded due to the defects and strain, resulting in largely increasing the lifetime of the diode. Moreover, since the number of defects can be thus decreased, the luminous efficiency of the diode can be improved as well as the operation voltage and the operation current can be decreased. Accordingly, the diode can attain high efficiency and small power consumption.

Also, since the substrate 61 is conductive, the n-type electrode 71 can be formed on the surface of the substrate 61 other than the device forming surface, the manufacturing process can be simplified as compared with the case where an insulating substrate is used.

In this embodiment, n-type Si is used as the substrate 61, but n-type GaAs, n-type InP or n-type GaP can be used instead. Also, as the substrate 61, n-type ZnO or n-type ZnS of the hexagonal system can be used, and in this case, the C surface is used as the main surface of the substrate 61.

Furthermore, GaSe is used as the buffer layer 62, but the buffer layer 62 can be of any multilayer van der Waals crystal such as GaS, InSe and $MoS_2$. Also, since the buffer layer 62 has the multilayer structure including several to several tens unit layers, the thickness is sufficiently small as a crystal. Accordingly, even when a current is allowed to flow in the vertical direction through the buffer layer 62, the resistance of the buffer layer 62 does not significantly affect the electric characteristic of the diode. Therefore, the buffer layer 62 can be doped to achieve an n-type or p-type conductivity or can be undoped.

EMBODIMENT 5

A fifth embodiment of the invention will now be described with reference to the accompanying drawing.

Figure 11:
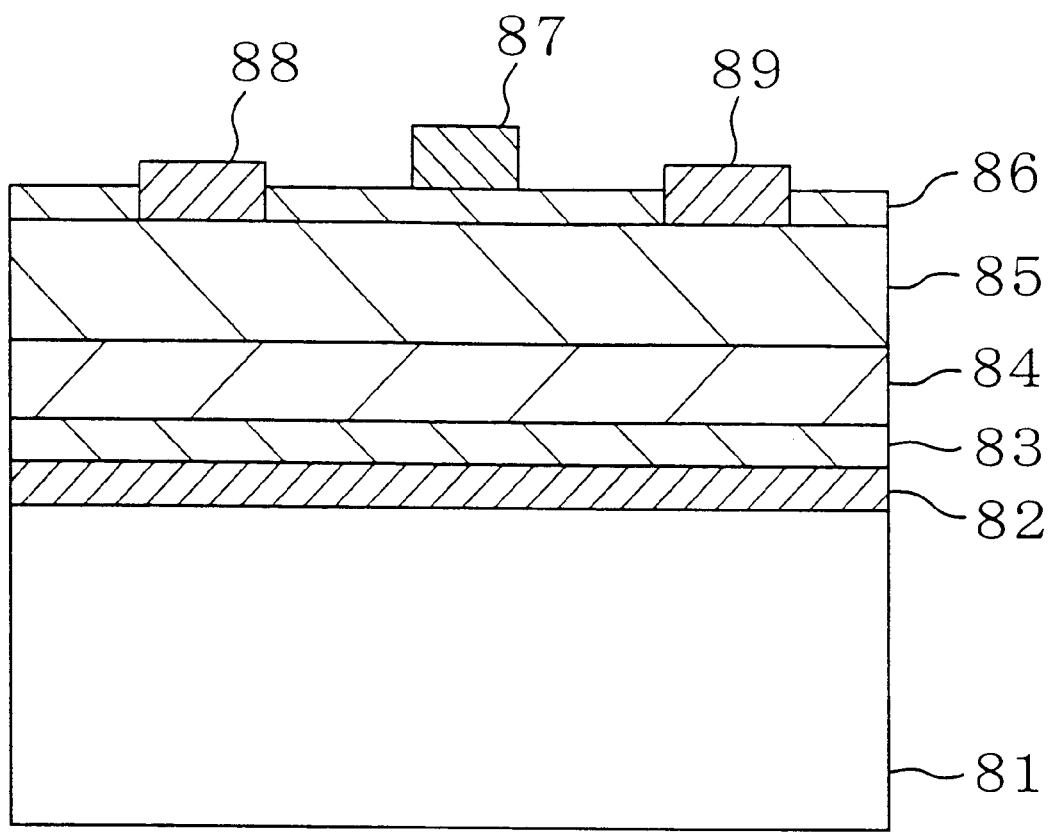
FIG. 11 is a sectional view for showing the structure of a high breakdown voltage electronic device according to a fifth embodiment of the invention.

FIG. 11 shows the sectional structure of a MESFET of an electronic device with a high breakdown voltage according to the fifth embodiment. As is shown in FIG. 11, on a substrate 81 of Si having the (111) surface orientation as the main surface, an epitaxial layer including the following layers in this order is formed: A buffer layer 82 of GaSe, that is, a van der Waals crystal, a semiconductor layer 83 of GaN, a first barrier layer 84 of AlN, a channel layer 85 of n-type GaN and a second barrier layer 86 of AlGaN. In this case, the first barrier layer 84 and the second barrier layer 86 have a function to confine electrons serving as a carrier within the channel layer.

On the second barrier layer 86, a gate electrode 87 of a metal Schottky-connected with the second barrier layer 86 is selectively formed, and in an area on the channel layer 85 in a direction along the gate length of the gate electrode 87, a source electrode 88 and a drain electrode 89 are formed with a distance from the ends of the gate electrode 87 in the direction along the gate length, so as to be ohmic-connected with the upper face of the channel layer 85. In this case, an n-type or p-type doped substrate can be used as the substrate 81 so as to form a transistor having four terminals. Also, the substrate 81 is not limited to Si, but InP, GaP, ZnS, ZnO or SiC can be used instead. The epitaxial layer of this embodiment is realized by the method or device for manufacturing a GaN semiconductor of the present invention. Specifically, on the substrate 81 of Si, which is inexpensive and has a high quality, the buffer layer 82 of the van der Waals crystal having a large degree of freedom in the bond is provided. Accordingly, the GaN epitaxial layer can attain high crystal quality, and a MESFET having a desired operation characteristic can be definitely manufactured at a low cost.

Also, a desired breakdown voltage and electron mobility, which is conventionally suppressed due to the defects, can be realized, and hence, a transistor resistant to an environment that cannot be conventionally resisted can be realized with a high breakdown voltage and a high frequency characteristic without requiring an additional mechanism for heat radiation.

EMBODIMENT 6

A sixth embodiment of the invention will now be described with reference to the accompanying drawings.

FIGS. 12(a) through 12(d) are schematic plan views for showing procedures in a method of manufacturing an opto-electronic integrated circuit (OEIC) according to the sixth embodiment of the invention.

Figure 12A:
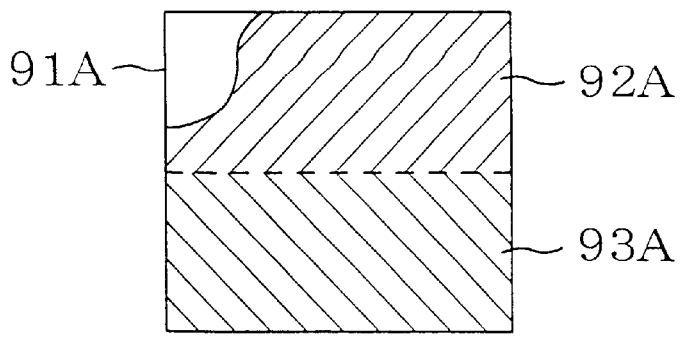
FIGS. 12($a$) through 12($d$) are plan views for showing procedures in a method of manufacturing an opto-electronic integrated circuit device according to a sixth embodiment of the invention.

First, as is shown in FIG. 12(a), on a substrate 91A of Si having the (111) surface orientation as the main surface, a first epitaxial layer 92A and a second epitaxial layer 93A of GaN semiconductors are respectively grown. The first epitaxial layer 92A and the second epitaxial layer 93A are respectively formed into desired epitaxial layers because devices to be formed therein are different from each other. For example, it is herein assumed that the first epitaxial layer 92A has the sectional structure as is shown in FIG. 10 and the second epitaxial layer 93A has the sectional structure as is shown in FIG. 11.

Figure 12B:
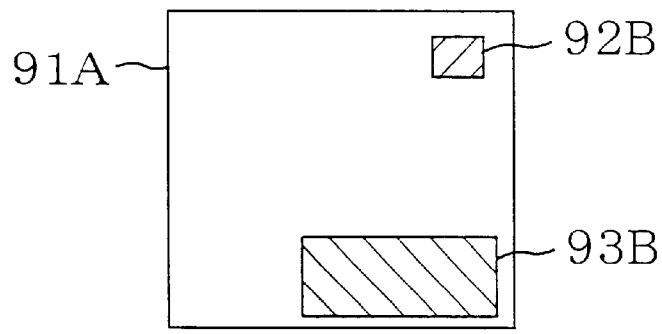

Next, as is shown in FIG. 12(b), a semiconductor laser diode 92B is formed in the first epitaxial layer 92A and a transistor circuit 93B is formed in the second epitaxial layer 93A. At this point, an area of the first epitaxial layer 92A excluding the semiconductor laser diode 92B and an area of the second epitaxial layer 93A excluding the transistor circuit 93B are removed, so as to bare the main surface of the substrate 91A in these areas.

Figure 12C:
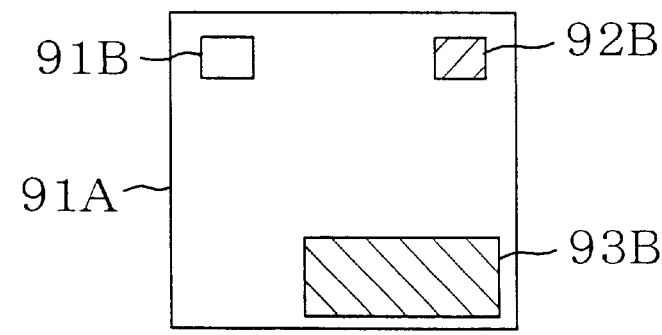
Figure 12D:
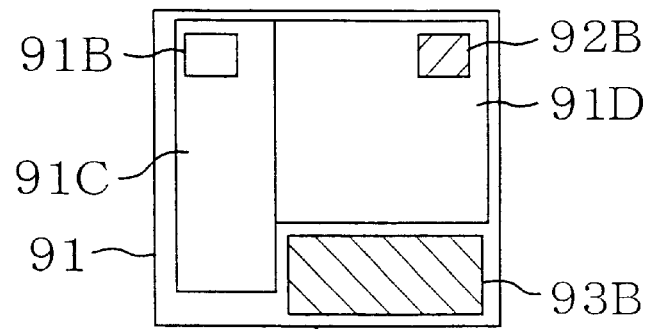

Then, as is shown in FIG. 12(c), a photodiode 91B is selectively formed on the main surface of the substrate 91A of Si. Subsequently, as is shown in FIG. 12(d), a first MOS transistor circuit 91C is formed in an area on the main surface of the substrate 91A including the photodiode 91B, and a second MOS transistor circuit 91D is formed in an area including the semiconductor laser diode 92B.

The first and second epitaxial layers 92A and 93A of this embodiment are realized by the method and device for manufacturing a GaN semiconductor of this invention. Specifically, even when the substrate 91A of Si which is inexpensive and has a high quality is used, the crystals of the GaN epitaxial layers have high quality. Therefore, it is thus possible to realize a monolithic opto-electronic integrated circuit in which a short wavelength semiconductor laser and a high breakdown voltage MESFET respectively having desired operation characteristics are integrated on the same substrate 91A.

In this manner, not only an electronic device or light emitting device is formed on a substrate of Si, GaAs or InP but also an electronic device with a high breakdown voltage or a short wavelength light emitting device can be integrated also in the GaN epitaxial layers grown on the substrate.

The description is herein given on the growth of the III-N semiconductor crystal, but the invention is not limited to the III-N semiconductor crystal but is effective in the growth of a crystal of the hexagonal system which is difficult to obtain with less defects and high quality.

Also, a van der Waals crystal is easily peeled between layers within the crystal or from another crystal continuously grown on this crystal. Therefore, for example, after a GaN crystal layer is grown on a van der Waals crystal into a sufficient thickness, the van der Waals crystal is peeled from the GaN crystal layer at the interface or the vicinity of the interface therebetween. Thus, a substrate of GaN can be obtained.

What is claimed is:

1. A method of manufacturing a semiconductor comprising:
   a buffer layer forming step of forming a buffer layer of a van der Waals crystal on a substrate having a crystal structure; and
   a semiconductor layer forming step of forming a semiconductor layer including gallium and nitride on said buffer layer,
   wherein said buffer layer is formed out of gallium selenide, gallium sulfide, indium selenide, indium sulfide, molybdenum selenide or molybdenum sulfide.

2. A method of manufacturing a semiconductor comprising:
   a buffer layer forming step of forming a buffer layer of a van der Waals crystal on a substrate having a crystal structure;
   a step of substituting atoms exposed on a surface of said buffer layer with group V atoms; and
   a semiconductor layer forming step of forming a semiconductor layer including gallium and nitride on said buffer layer.

3. The method of manufacturing a semiconductor of claim 2,
   wherein said group V atoms are nitrogen atoms.

4. A method of manufacturing a semiconductor comprising:
   a buffer layer forming step of forming a buffer layer of a van der Waals crystal on a substrate having a crystal structure; and
   a semiconductor layer forming step of forming a semiconductor layer including gallium and nitride on said buffer layer,
   wherein said buffer layer forming step is conducted by atomic layer epitaxy or migration enhanced epitaxy.

5. A method of manufacturing a semiconductor comprising:
   a buffer layer forming step of forming a buffer layer of a van der Waals crystal on a substrate having a crystal structure; and
   a semiconductor layer forming step of forming a semiconductor layer including gallium and nitride on said buffer layer,
   wherein a buffer layer growth chamber used for forming said buffer layer in said buffer layer forming step is different from a semiconductor layer growth chamber used for forming said semiconductor layer in said semiconductor layer forming step.

6. A method of manufacturing a semiconductor comprising:
   a buffer layer forming step of forming a buffer layer of a van der Waals crystal on a substrate having a crystal structure; and
   a semiconductor layer forming step of forming a semiconductor layer including gallium and nitride on said buffer layer,
   wherein said semiconductor layer forming step includes a step of supplying a gallium source to a growth chamber used for growing a crystal layer on said substrate and a step of supplying a nitrogen source to said growth chamber, and in said step of supplying said nitrogen source, an ammonia gas is supplied to said growth chamber in an amount required for growth of said semiconductor layer without deterioration of a degree of vacuum in said growth chamber.

7. A method of manufacturing a semiconductor comprising:
   a buffer layer forming step of forming a buffer layer of a van der Waals crystal on a substrate having a crystal structure; and
   a semiconductor layer forming step of forming a semiconductor layer including gallium and nitride on said buffer layer,
   wherein said semiconductor layer forming step includes:
   a substrate placing step of placing, in a growth chamber, said substrate on which said buffer layer is formed;
   a gallium supplying step of supplying gallium in the form of a molecular beam onto said buffer layer; and
   an ammonia gas supplying step of supplying an ammonia gas onto said buffer layer through an electromagnetic valve provided to said growth chamber.

8. The method of manufacturing a semiconductor of claim 7,
   wherein a time interval is provided between said gallium supplying step and said ammonia gas supplying step.

9. The method of manufacturing a semiconductor of claim 7,
   wherein said semiconductor layer forming step includes a nitrogen gas supplying step of supplying a nitrogen gas in the form of plasma as a nitrogen source to said growth chamber.

10. A method of manufacturing a semiconductor comprising:
    a semiconductor layer forming step of forming a semiconductor layer including gallium and nitrogen on a substrate placed in a growth chamber, with at least a gallium source and a nitrogen source supplied and said supplied gallium source and nitrogen source reacted with each other on said substrate, and with an ammonia gas serving as said nitrogen source supplied to said growth chamber in an amount required for growth of said semiconductor layer without deterioration of a degree of vacuum in said growth chamber.

11. The method of manufacturing a semiconductor of claim 10,
    wherein said semiconductor layer forming step includes:
    a substrate placing step of placing said substrate in said growth chamber;
    a gallium supplying step of supplying gallium in the form of a molecular beam as said gallium source onto a main surface of said substrate; and
    an ammonia gas supplying step of supplying said ammonia gas onto the main surface of said substrate through an electromagnetic valve provided to said growth chamber.

12. The method of manufacturing a semiconductor of claim 11,
wherein a time interval is provided between said gallium supplying step and said ammonia gas supplying step.

13. The method of manufacturing a semiconductor of claim 11,
wherein said semiconductor layer forming step includes a nitrogen gas supplying step of supplying a nitrogen gas in the form of plasma to said growth chamber as said nitrogen source.

14. The method of manufacturing a semiconductor of claim 11, wherein said electromagnetic valve is provided within said growth chamber.

15. The method of manufacturing a semiconductor of claim 11, wherein said electromagnetic valve can be opened and closed with a time period of 0.1 seconds.

16. The method of manufacturing a semiconductor of claim 11, wherein said electromagnetic valve has a leakage rate of approximately $1 \times 10^{-5}$ or less.

* * * * *

UNITED STATES PATENT AND TRADEMARK OFFICE
CERTIFICATE OF CORRECTION

PATENT NO. : 6,323,053 B1
DATED : November 27, 2001
INVENTOR(S) : Takashi Nishikawa et al.

It is certified that error appears in the above-identified patent and that said Letters Patent is hereby corrected as shown below:

Title page,
Under Item [54], change " GAN " to -- GaN --; change " SI " to -- Si --; and change " GASE " to -- GaSe --
Therefore the Title should be appear as:
-- GROWTH OF GaN ON Si SUBSTRATE USING GaSe BUFFER LAYER --

Signed and Sealed this

Nineteenth Day of March, 2002

Attest:

JAMES E. ROGAN
Attesting Officer
Director of the United States Patent and Trademark Office